(12) United States Patent
Lam

(10) Patent No.: US 12,057,868 B2
(45) Date of Patent: Aug. 6, 2024

(54) POWER DETECTORS WITH ENHANCED DYNAMIC RANGE

(71) Applicant: Skyworks Solutions, Inc., Irvine, CA (US)

(72) Inventor: Lui Lam, Lexington, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 18/304,163

(22) Filed: Apr. 20, 2023

(65) Prior Publication Data

US 2023/0344455 A1  Oct. 26, 2023

Related U.S. Application Data

(63) Continuation of application No. 16/947,068, filed on Jul. 16, 2020, now Pat. No. 11,664,833.

(60) Provisional application No. 62/877,457, filed on Jul. 23, 2019.

(51) Int. Cl.
| | |
|---|---|
| *H03F 1/34* | (2006.01) |
| *H03F 3/189* | (2006.01) |
| *H03G 3/30* | (2006.01) |
| *H04B 1/04* | (2006.01) |
| *H03F 1/36* | (2006.01) |

(52) U.S. Cl.
CPC ........... *H04B 1/0458* (2013.01); *H03F 3/189* (2013.01); *H03G 3/3042* (2013.01); *H03F 1/36* (2013.01)

(58) Field of Classification Search
CPC ......... H04B 1/0458; H03F 3/189; H03F 1/36; H03F 2200/294; H03F 2200/516; H03F 1/0227; H03F 1/0266; H03F 2200/207; H03F 2200/451; H03F 3/24; H03G 3/3042

See application file for complete search history.

(56) References Cited

U.S. PATENT DOCUMENTS

| | | |
|---|---|---|
| 5,381,115 A | 1/1995 | Timmons et al. |
| 6,329,880 B2 | 12/2001 | Akiya |
| 6,397,077 B1 | 5/2002 | Jensen |
| 6,476,677 B1 | 11/2002 | Komaili et al. |
| 7,299,015 B2 | 11/2007 | Iwamiya et al. |
| 7,804,922 B2 | 9/2010 | Shi et al. |
| 8,103,226 B2 | 1/2012 | Andrys et al. |
| 8,188,793 B2 | 5/2012 | Ripley et al. |
| 8,319,557 B2 | 11/2012 | Prikhodko et al. |
| 8,385,853 B2 | 2/2013 | Prikhodko et al. |
| 8,452,243 B2 | 5/2013 | Prikhodko et al. |
| 8,666,337 B2 | 3/2014 | Ripley et al. |
| 8,749,273 B2 | 6/2014 | Andrys et al. |

(Continued)

*Primary Examiner* — Khanh V Nguyen
(74) *Attorney, Agent, or Firm* — Knobbe, Martens, Olson & Bear, LLP

(57) ABSTRACT

Apparatus and methods for power detection with enhanced dynamic range are provided. In certain embodiments, a front end system includes a power amplifier that amplifies a radio frequency (RF) input signal to generate an RF output signal, a directional coupler that generates a sensed RF signal based on sensing the RF output signal from the power amplifier, and a power detector that processes the sensed RF signal to generate a detection signal indicating an output power of the power amplifier. Additionally, the power detector includes two or more detection paths providing different amounts of gain to the sensed RF signal from the directional coupler.

20 Claims, 8 Drawing Sheets

(56) References Cited

U.S. PATENT DOCUMENTS

| | | | |
|---|---|---|---|
| 8,928,356 B2 | 1/2015 | Andrys et al. | |
| 9,306,526 B2 | 4/2016 | Lam et al. | |
| 9,362,870 B2 | 6/2016 | Lam et al. | |
| 9,425,852 B2 | 8/2016 | Lam et al. | |
| 9,503,026 B2 | 11/2016 | Lam et al. | |
| 9,515,611 B2 | 12/2016 | Andrys et al. | |
| 9,608,576 B2 | 3/2017 | Lam | |
| 9,628,029 B2 | 4/2017 | Huang et al. | |
| 9,641,146 B2 | 5/2017 | Nash et al. | |
| 9,705,554 B2 | 7/2017 | Li et al. | |
| 9,735,815 B1 * | 8/2017 | Hirai | H03F 3/19 |
| 9,787,258 B2 | 10/2017 | Lam et al. | |
| 9,813,027 B2 | 11/2017 | Quaglietta et al. | |
| 9,825,591 B2 | 11/2017 | Lam et al. | |
| 9,866,244 B2 | 1/2018 | Srirattana et al. | |
| 9,960,793 B2 | 5/2018 | Anthony et al. | |
| 10,003,308 B2 | 6/2018 | Lam | |
| 10,629,553 B2 * | 4/2020 | Soliman | H05B 47/19 |
| 11,664,833 B2 | 5/2023 | Lam | |
| 2006/0035600 A1 * | 2/2006 | Lee | H04B 1/18 455/24 |
| 2010/0317299 A1 | 12/2010 | Shi et al. | |
| 2016/0227603 A1 | 8/2016 | Huang et al. | |
| 2016/0381649 A1 | 12/2016 | Anthony et al. | |
| 2017/0005691 A1 | 1/2017 | Li et al. | |
| 2017/0099608 A1 | 4/2017 | Lam et al. | |
| 2017/0124008 A1 | 5/2017 | Chen et al. | |
| 2017/0124013 A1 | 5/2017 | Vaillancourt et al. | |
| 2017/0155383 A1 | 6/2017 | Andrys et al. | |
| 2017/0187331 A1 | 6/2017 | Lam et al. | |
| 2017/0302231 A1 | 10/2017 | Ripley et al. | |
| 2017/0338776 A1 | 11/2017 | Huang et al. | |
| 2017/0373368 A1 | 12/2017 | Srirattana et al. | |
| 2018/0034424 A1 | 2/2018 | Lam et al. | |
| 2018/0054169 A1 | 2/2018 | Lam et al. | |
| 2018/0062585 A1 | 3/2018 | Quaglietta et al. | |
| 2018/0138861 A1 | 5/2018 | Lam et al. | |
| 2018/0331661 A1 | 11/2018 | Lam | |
| 2019/0079549 A1 | 3/2019 | Lam et al. | |
| 2019/0103890 A1 | 4/2019 | Anthony et al. | |
| 2019/0140595 A1 | 5/2019 | Lam et al. | |
| 2019/0182894 A1 | 6/2019 | Huang et al. | |
| 2019/0260367 A1 | 8/2019 | Andrys et al. | |
| 2019/0319585 A1 | 10/2019 | Lam et al. | |
| 2019/0379099 A1 | 12/2019 | Srirattana et al. | |
| 2019/0386619 A1 | 12/2019 | Huang et al. | |
| 2020/0041357 A1 | 2/2020 | Lam | |
| 2020/0106395 A1 | 4/2020 | Quaglietta et al. | |
| 2020/0162032 A1 | 5/2020 | Ripley et al. | |
| 2020/0162034 A1 | 5/2020 | Lam et al. | |
| 2020/0266777 A1 | 8/2020 | Arfaei Malekzadeh et al. | |

\* cited by examiner

POWER DETECTORS WITH ENHANCED DYNAMIC RANGE

CROSS-REFERENCE TO RELATED APPLICATIONS

This application is a continuation of U.S. application Ser. No. 16/947,068, filed Jul. 16, 2020 and titled "POWER DETECTORS WITH ENHANCED DYNAMIC RANGE," which claims the benefit of priority under 35 U.S.C. § 119 of U.S. Provisional Patent Application No. 62/877,457, filed Jul. 23, 2019 and titled "POWER DETECTORS WITH ENHANCED DYNAMIC RANGE," each of which is herein incorporated by reference in its entirety.

BACKGROUND

Field

Embodiments of the invention relate to electronic systems, and in particular, to power amplifiers for radio frequency (RF) electronics.

Description of the Related Technology

Power amplifiers are used in radio frequency (RF) communication systems to amplify RF signals for transmission via antennas. It can be important to manage the power of RF signal transmissions to prolong battery life and/or provide a suitable transmit power level.

Examples of RF communication systems with one or more power amplifiers include, but are not limited to mobile phones, tablets, base stations, network access points, laptops, and wearable electronics. Power amplifiers provide amplification to RF signals, which can have a frequency in the range from about 30 kHz to 300 GHz, such as in the range of about 410 MHz to about 7.125 GHz for fifth generation (5G) communications using Frequency Range 1 (FR1).

SUMMARY

In certain embodiments, the present disclosure relates to a front end system. The front end system includes a power amplifier configured to amplify a radio frequency input signal to generate a radio frequency output signal, a directional coupler configured to generate a sensed radio frequency signal based on sensing the radio frequency output signal from the power amplifier, and a power detector configured to process the sensed radio frequency signal to generate a detection signal indicating an output power of the power amplifier. The power detector includes two or more detection paths providing different amounts of gain to the sensed radio frequency signal so as to widen a dynamic range of the power detector.

In various embodiments, the power detector further includes an amplifier, and the two or more detection paths include a first detection path bypassing the amplifier and a second detection path through the amplifier. According to a number of embodiments, the power amplifier operates in a transmit path of the front end system and the amplifier corresponds to a low noise amplifier operating in a receive path of the front end system. In accordance with several embodiments, the power detector is configured to use the low noise amplifier during a transmit time slot of a communication link that is duplexed by time division duplexing.

In some embodiments, the power detector further includes a rectifier, and the two or more detection paths are each connected between the directional coupler and the rectifier. According to a number of embodiments, the power detector further includes a linear to logarithmic circuit configured to control generation of the detection signal based on a rectified signal from the rectifier.

In various embodiments, the front end system further includes a serial interface configured to receive transmit power control data, and the power detector is configured to select a detection path from amongst two or more detection paths based on the transmit power control data.

In several embodiments, the front end system further includes a coarse power detection circuit configured to generate a coarse power detection signal indicating a power of the radio frequency input signal, and the power detector is configured to select a detection path from amongst two or more detection paths based on the coarse power detection signal.

In certain embodiments, the present disclosure relates to a mobile device. The mobile device includes a transceiver configured to generate a radio frequency input signal, an antenna configured to transmit a radio frequency output signal, and a front end system including a power amplifier configured to amplify the radio frequency input signal to generate the radio frequency output signal, a directional coupler configured to generate a sensed radio frequency signal based on sensing the radio frequency output signal, and a power detector configured to process the sensed radio frequency signal to generate a detection signal indicating an output power of the power amplifier. The power detector includes two or more detection paths providing different amounts of gain to the sensed radio frequency signal.

In various embodiments, the power detector further includes an amplifier, and the two or more detection paths includes a first detection path bypassing the amplifier and a second detection path through the amplifier. According to several embodiments, the front end system includes a transmit path from the transceiver to the antenna through the power amplifier, and a receive path from the antenna to the transceiver through a low noise amplifier, and the low noise amplifier corresponding to the amplifier of the power detector. In accordance with a number of embodiments, the power detector is configured to use the low noise amplifier during a transmit time slot of a communication link that is duplexed by time division duplexing.

In some embodiments, the power detector further includes a rectifier, and the two or more detection paths are each connected between the directional coupler and the rectifier. According to several embodiments, the power detector further includes a linear to logarithmic circuit configured to control generation of the detection signal based on a rectified signal from the rectifier.

In various embodiments, the mobile device further includes a baseband processor configured to control a transmit power level of the radio frequency output signal based on the detection signal. According to a number of embodiments, the baseband processor is further configured to provide transmit power control data to the front end system, and the power detector is configured to select a detection path from amongst two or more detection paths based on the transmit power control data. In accordance with several embodiments, the baseband processor is further configured to provide digital signal data to the transceiver, and the digital signal data represents the radio frequency input signal.

In some embodiments, the transceiver includes a modulator configured to receive the digital signal data and to output the radio frequency input signal.

In several embodiments, the front end system further includes a coarse power detection circuit configured to generate a coarse power detection signal indicating a power of the radio frequency input signal, and the power detector is configured to select a detection path from amongst two or more detection paths based on the coarse power detection signal.

In certain embodiments, the present disclosure relates to a method of transmit power detection with wide dynamic range. The method includes amplifying a radio frequency input signal to generate a radio frequency output signal using a power amplifier, sensing the radio frequency output signal to generate a sensed radio frequency signal using a directional coupler, and processing the sensed radio frequency signal to generate a detection signal indicating an output power of the power amplifier using a power detector, including selecting a detection path of the power detector from amongst two or more detection paths providing different amounts of gain.

In various embodiments, selecting the detection path includes selecting amongst a first detection path bypassing an amplifier and a second detection path through the amplifier. According to a number of embodiments, the method further includes reusing a low noise amplifier in a receive path from an antenna to a transceiver as the amplifier of the power detector. In accordance with several embodiments, the method further includes amplifying the sensed radio frequency signal using the low noise amplifier during a transmit time slot of a communication link that is duplexed by time division duplexing.

In some embodiments, the method further includes providing the sensed radio frequency signal to a rectifier through the selected detection path. In accordance with various embodiments, the method further includes processing a rectified signal from the rectifier using a linear to logarithmic circuit.

In several embodiments, the method further includes controlling a transmit power level of the radio frequency output signal based on the detection signal using a baseband processor. According to a number of embodiments, the method further includes receiving transmit power control data from the baseband processor, and selecting the detection path based on the transmit power control data. According to various embodiments, the method further includes providing digital signal data from the baseband processor to the transceiver, the digital signal data representing the radio frequency input signal.

In a number of embodiments, the method further includes generating a coarse power detection signal indicating a power of the radio frequency input signal using a coarse power detection circuit, and selecting the detection path based on the coarse power detection signal.

DETAILED DESCRIPTION OF EMBODIMENTS

Figure 1:
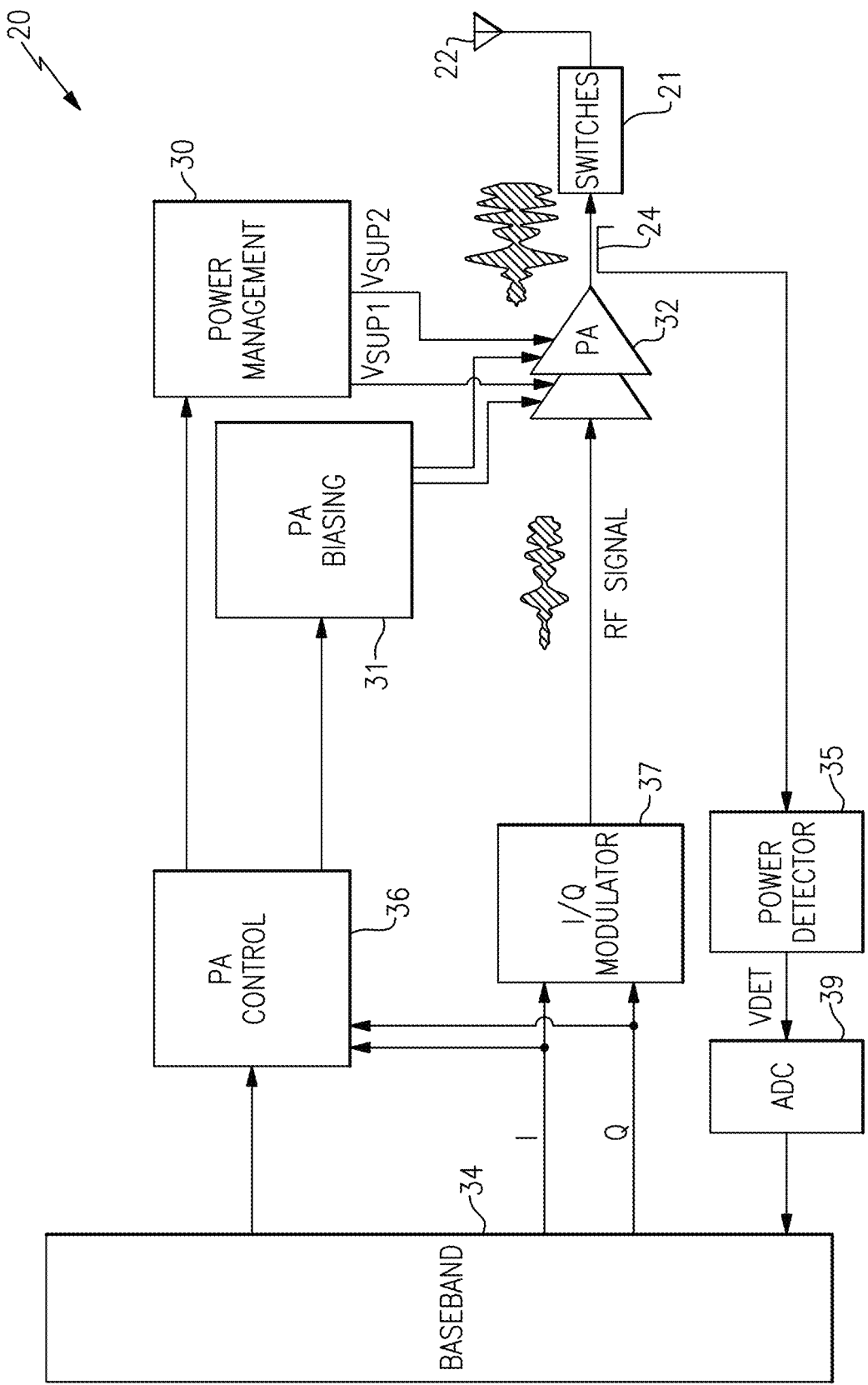
FIG. 1 is a schematic diagram of one embodiment of a power amplifier system.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

In mobile applications, such as cellular and/or Wi-Fi communications, it is important to control transmit power to manage signal strength and/or to prolong battery lifetime.

To aid in controlling transmit power level, a power detector can be included for detecting the output power of a power amplifier. For example, the power detector can operate in a power control loop from the output of the power amplifier to an input of a baseband processor. Such a power control loop can include a directional coupler for sensing the RF output signal of the power amplifier, a power detector for generating a detection signal based on the sensed RF signal, and an analog-to-digital converter (ADC) for converting the detection signal to a digital format suitable for processing by the baseband processor.

In certain applications, a wide dynamic range for detecting transmit power is desired. For instance, in an IEEE 802.11ax application, it can be desirable to detect transmit power over a dynamic range of 32 dB or more. Such wide dynamic range can aid in accurately detecting transmit power when the power amplifier operates with backed-off power. This in turn enables power control and jamming prevention when multiple wireless devices simultaneously communicate with a wireless access point at various distances.

Power detectors with enhanced dynamic range are provided herein. In certain embodiments, a front end system includes a power amplifier that amplifies an RF input signal to generate an RF output signal, a directional coupler that generates a sensed RF signal based on sensing the RF output signal from the power amplifier, and a power detector that processes the sensed RF signal to generate a detection signal indicating an output power of the power amplifier. Additionally, the power detector includes two or more detection paths providing different amounts of gain to the sensed RF signal from the directional coupler.

By implementing the power detector in this manner, the dynamic range of the power detector is enhanced. Accordingly, accurate transmit power detection can be achieved not only at high output power levels near a peak power level of the power amplifier, but also at backed off power levels. Detecting transmit power at low power levels can serve a wide variety of functions, including, but not limited to accurate power control to mitigate jamming issues when multiple wireless devices simultaneously communicate with a wireless access point at different distances.

In certain implementations, the power detector includes a first detection path in which an amplifier is bypassed and a second detection path including the amplifier. Accordingly, the power detector's amplifier can be selectively bypassed to control the input signal power level to the power detector and achieve wide dynamic range.

In one example, the amplifier used by the power detector corresponds to a dedicated amplifier of the power detector. In a second example, the amplifier corresponds to a low noise amplifier (LNA) in a receive path of the RF communication system that is used by the power detector when the receive path is inactive. For instance, the front end system can operate at least in part using time division duplexing (TDD), and the front end system's receive path can be inactive during transmit time slots and active during receive time slots. Thus, the LNA can be selectively used during transmit time slots in TDD applications to boost the sensed RF signal from the directional coupler to widen the power detector's dynamic range.

One example of TDD communication systems are wireless local area network (WLAN) communication systems, such as W-Fi enabled devices. Another example of TDD communication system are cellular communications systems that operate at least in part using TDD, for instance, fifth generation (5G) communication systems, also referred to as fifth generation new radio (5G NR) systems. Thus, the teachings herein are applicable to WLAN communication systems, 5G NR communication systems, as well as to communication systems using other standards and protocols.

In certain implementations, the particular detection path used by the power detector is selected based on data received from a baseband processor. For example, the baseband processor can provide the front end system with transmit power control data indicating a desired transmit power level of the power amplifier, and the transmit power control data can be processed to control the state of switches used to select which detection path of the power detector is used. In another implementation, a coarse power detection circuit is used to generate a coarse power detection signal indicating a detected power level of the power amplifier, and the coarse power detection signal is used by the power detector to select the particular detection path that is used.

FIG. 1 is a schematic diagram of one embodiment of a power amplifier system 20. The illustrated power amplifier system 20 includes switches 21, an antenna 22, a directional coupler 24, a power management circuit 30, a power amplifier biasing circuit 31, a power amplifier 32, a baseband processor 34, a power detector 35, a power amplifier control circuit 36, an I/Q modulator 37, and an ADC 39.

Although FIG. 1 illustrates one embodiment of a power amplifier system, the teachings herein are applicable to power amplifier systems implemented in a wide variety of ways. For example, a power amplifier system can include more or fewer components, a different arrangement of components, and/or components implemented in different ways.

The baseband signal processor 34 can be used to generate an in-phase (I) signal and a quadrature-phase (Q) signal, which represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power amplifier system 20.

Although not illustrated in FIG. 1 for clarity, the baseband processor 34 can also process signals received from one or more antennas (for example, the antenna 22 and/or other antenna(s)) by way of one or more receive paths. Thus, the baseband processor 34 can process signals associated with one or more receive paths, one or more transmit paths, and/or one or more observation paths.

The I/Q modulator 37 can be configured to receive the I and Q signals from the baseband processor 34 and to process the I and Q signals to generate an RF signal. For example, the I/Q modulator 37 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 32. In certain implementations, the I/Q modulator 37 can include one or more filters configured to filter frequency content of signals processed therein.

The power amplifier 32 can receive the RF signal from the I/Q modulator 37, and when enabled can provide an amplified RF signal to the antenna 22 via the switches 21. The directional coupler 24 can be positioned between the output of the power amplifier 32 and the input of the switches 21, thereby allowing an output power measurement of the power amplifier 32 that does not include insertion loss of the switches 21. However, other configurations of power measurement are possible.

In the illustrated configuration, the sensed output signal from the directional coupler 24 is provided to the power detector 35, which processes the sensed output signal to generate a detection signal VDET. The detection signal VDET can be provided to the ADC 39, which can convert the detection signal VDET to a digital format suitable for processing by the baseband processor 34.

By including a feedback path from the output of the power amplifier 32 and an input to the baseband processor 34, the baseband processor 34 can be configured to dynamically adjust the I and Q signals to optimize the operation of the power amplifier system 20. For example, configuring the power amplifier system 20 in this manner aids in controlling transmit power, PAE, and/or linearity of the power amplifier 32.

In the illustrated embodiment, the power management circuit 30 receives a power control signal from the power amplifier control circuit 36, and controls the supply voltages of the power amplifier 32. In certain implementations, the power control signal is communicated by way of a serial interface.

As shown in FIG. 1, the power management circuit 30 generates a first supply voltage $V_{CC1}$ for powering an input stage of the power amplifier 32 and a second supply voltage $V_{CC2}$ for powering an output stage of the power amplifier 32, in this embodiment. The power management circuit 30 can control the voltage level of the first supply voltage $V_{CC1}$ and/or the second supply voltage $V_{CC2}$ to enhance the power amplifier system's PAE. Although an embodiment with two controllable supply voltages is shown, a power management circuit can control the voltage levels of more or fewer supply voltages. In certain implementations, a power amplifier operates with one or more controllable supply voltages and one or more substantially fixed supply voltages.

In the illustrated embodiment, the power control signal instructs the power management circuit 30 to operate in a particular supply control mode, such as an APT mode or an ET mode. Thus, the power amplifier control circuit 36 controls the selected supply control mode, in this embodiment.

As shown in FIG. 1, the power amplifier biasing circuit 31 receives a bias control signal from the power amplifier control circuit 36, and generates bias control signals for the power amplifier 32. Additionally, the power amplifier biasing circuit 31 generates the bias control signals based on the bias control signal.

The bias control signal identifies the supply control mode that the power management circuit 30 is operating in, and the power amplifier biasing circuit 31 generates the bias control signals based on the indicated supply control mode. In certain implementations, the supply control mode is communicated by way of a serial interface.

Figure 2:
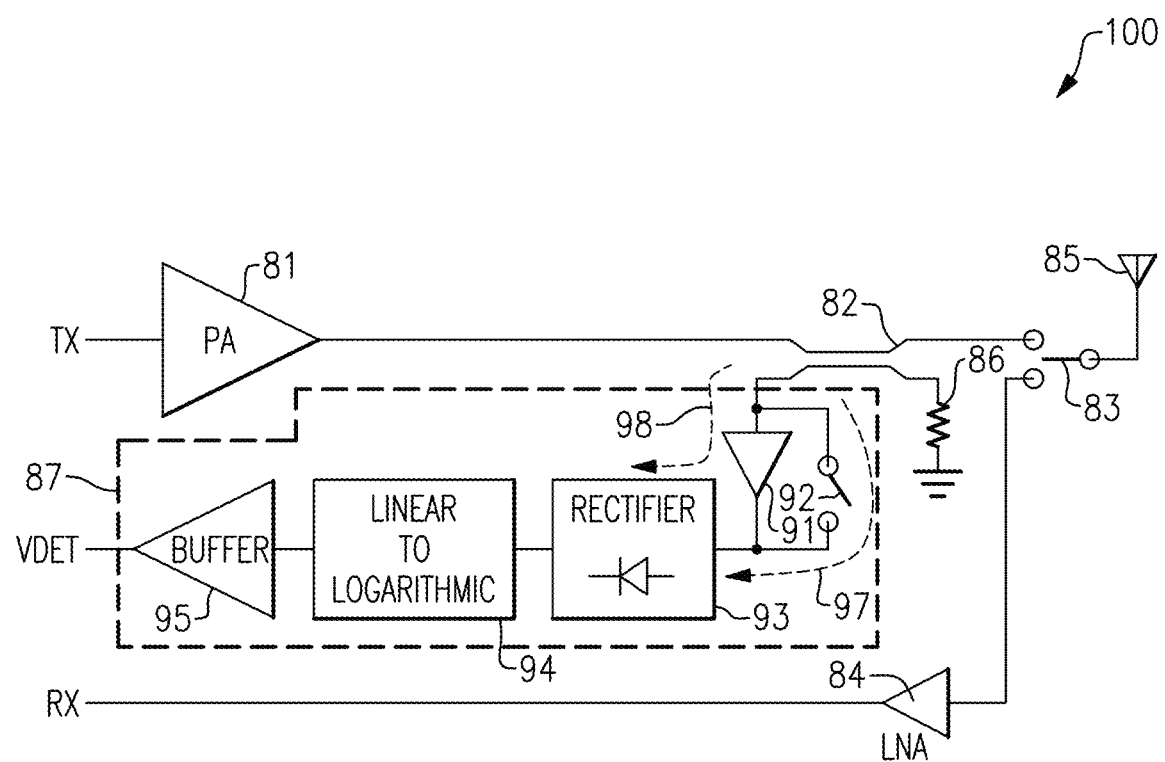
FIG. 2 is a schematic diagram of one embodiment of a front end system.

FIG. 2 is a schematic diagram of one embodiment of a front end system 100. The front end system 100 includes a power amplifier 81, a directional coupler 82, a transmit/receive switch 83, a low noise amplifier 84, an antenna 85, a termination resistor 86, and a power detector 87.

Although one embodiment of a front end system is depicted, the teachings herein are applicable to front end systems implemented in a wide variety of ways.

The power amplifier 81 includes an input that receives an RF transmit signal TX, and output that provides an amplified RF transmit signal to the antenna 85 along a transmit path through the directional coupler 82 and the transmit/receive switch 83. Additionally, the low noise amplifier 84 includes an input that receives an RF signal from the antenna 85 by way of a receive path through the transmit/receive switch 83, and an output that provides an amplified received signal RX.

As shown in FIG. 2, the front end system 100 includes the directional coupler 82 and the power detector 87 for detecting an output power of the power amplifier 81. In the illustrated embodiment, the directional coupler 82 includes an input port (P1) connected to the output of the power amplifier 81, a transmitted port (P2) connected to the antenna 85 by way of the transmit/receive switch 83, a coupled port (P3) connected to ground by way of the termination resistor 86, and an isolated port (P4) that provides a coupled or sensed RF signal to an input of the power detector 87.

With continuing reference to FIG. 2, the power detector 87 includes an amplifier 91, a bypass switch 92, a rectifier 93, a linear to logarithmic detector 94, and a buffer 95, in this embodiment. The rectifier 93 rectifies an RF input signal to generate a rectified signal for the linear to logarithmic detector 94. The linear to logarithmic detector 94 processes the rectified signal to generate a logarithmic detection signal, which is buffered by the buffer 95 to generate a detection signal VDET. The detection signal VDET in turn is processed (for instance, by a baseband processor) to achieve transmit power control. Although one embodiment of power detector circuitry is shown, the teachings herein are applicable to other implementations of power detectors.

As shown in FIG. 2, the power detector 87 includes multiple detection paths from the directional coupler 82 to the input of the rectifier 93. In the illustrated embodiment, the multiple detection paths include a first detection path 97 through the bypass switch 92 and a second detection path 98 through the amplifier 91. Since the first detection path 97 bypasses the amplifier 91 and the second detection path 98 includes the amplifier 91, the second detection path 98 has a higher gain then the first detection path 97.

Thus, the power detector 87 includes a first detection path 97 in which the amplifier 91 is bypassed and a second detection path 98 including the amplifier 91. Accordingly, the amplifier 91 can be selectively bypassed to control the input signal power level to the power detector 87.

By implementing the power detector 87 in this manner, the dynamic range of the power detector 87 is enhanced. Accordingly, accurate transmit power detection and control can be achieved not only at high output power levels near a peak operating range of the power amplifier 81, but also at backed off power levels. Detecting transmit power detection at low power levels can serve a wide variety of functions, including, but not limited to accurate power control at low power levels to mitigate jamming issues when multiple wireless devices simultaneously communicate with a wireless access point.

The bypass switch 92 can be controlled in a wide variety of ways. In one example, a baseband processor provides the front end system 100 with transmit power control data indicating a transmit power of the power amplifier 81, and the power detector 87 uses the transmit power control data to control a state of the bypass switch 92. In another example, the front end system 100 further includes a coarse power detection circuit that generates a coarse power detection signal indicating a detected power level of the power amplifier 81, and the coarse power detection signal is used by the power detector 87 to selectively activate the bypass switch 92.

Figure 3:
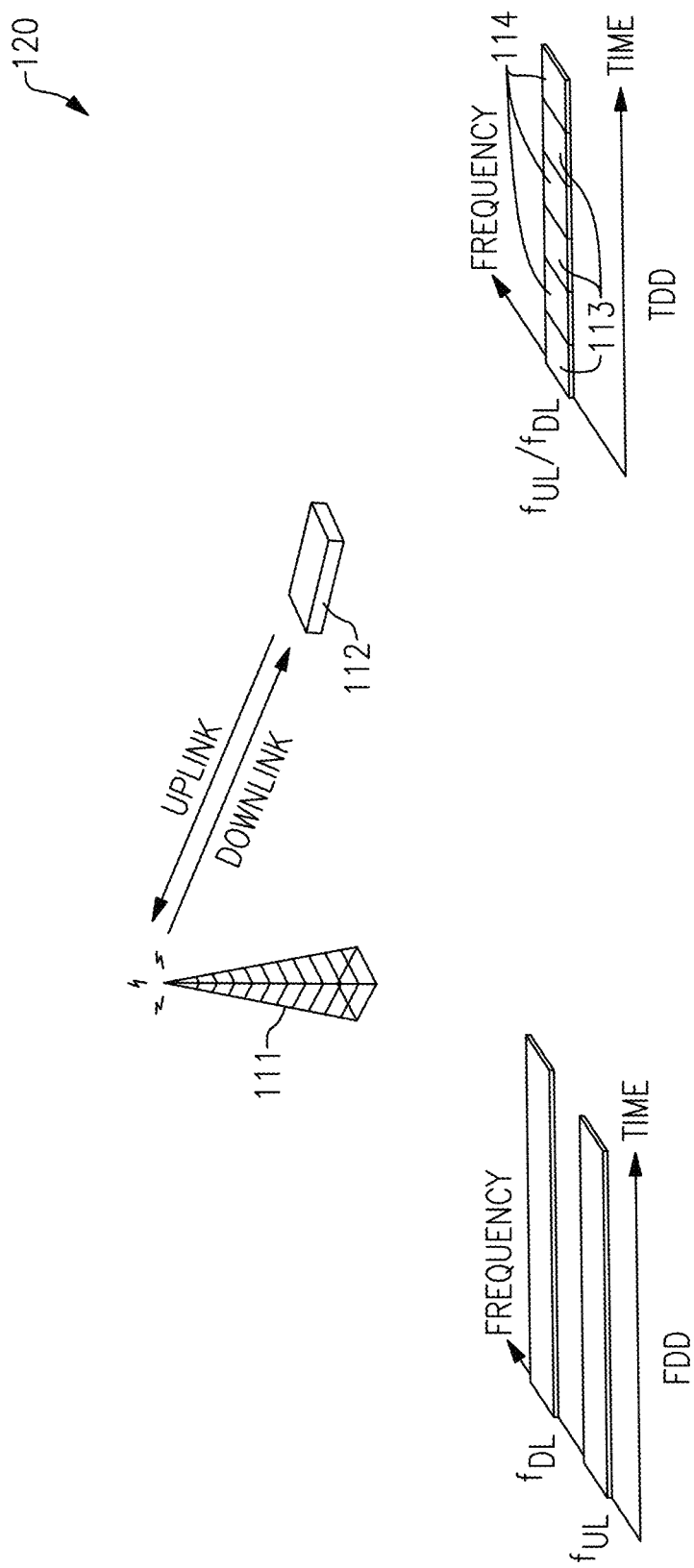
FIG. 3 is a schematic diagram illustrating various duplexing techniques for a wireless network.

FIG. 3 is a schematic diagram illustrating various duplexing techniques for a wireless network 120. As shown in FIG. 3, the wireless network 120 includes a base station 111 and a mobile device 112. Additionally, the base station 111 transmits a downlink signal to the mobile device 112, and the mobile device 112 transmits an uplink signal to the base station 111.

The wireless network 120 is annotated to include a first graph of frequency versus time for frequency division duplexing (FDD) and a second graph of frequency versus time for time division duplexing (TDD).

As shown in FIG. 3, when communicating using FDD, the uplink signal and the downlink signal are transmitted concurrently by way of separate frequencies. For example, the uplink signal can be transmitted using an uplink carrier frequency $f_{UL}$, while the downlink signal can be transmitted using a downlink carrier frequency $f_{DL}$ that is separated in frequency from the uplink carrier frequency $f_{UL}$.

With continuing reference to FIG. 3, the uplink signal and the downlink signal are transmitted over a common frequency during different time slots when communicating using TDD. For example, the uplink signal can be transmitted during transmit time slots 113 over a shared carrier frequency $f_{UL}/f_{DL}$, while the downlink signal can be transmitted during receive time slots 114 over the shared carrier frequency $f_{UL}/f_{DL}$.

Figure 4A:
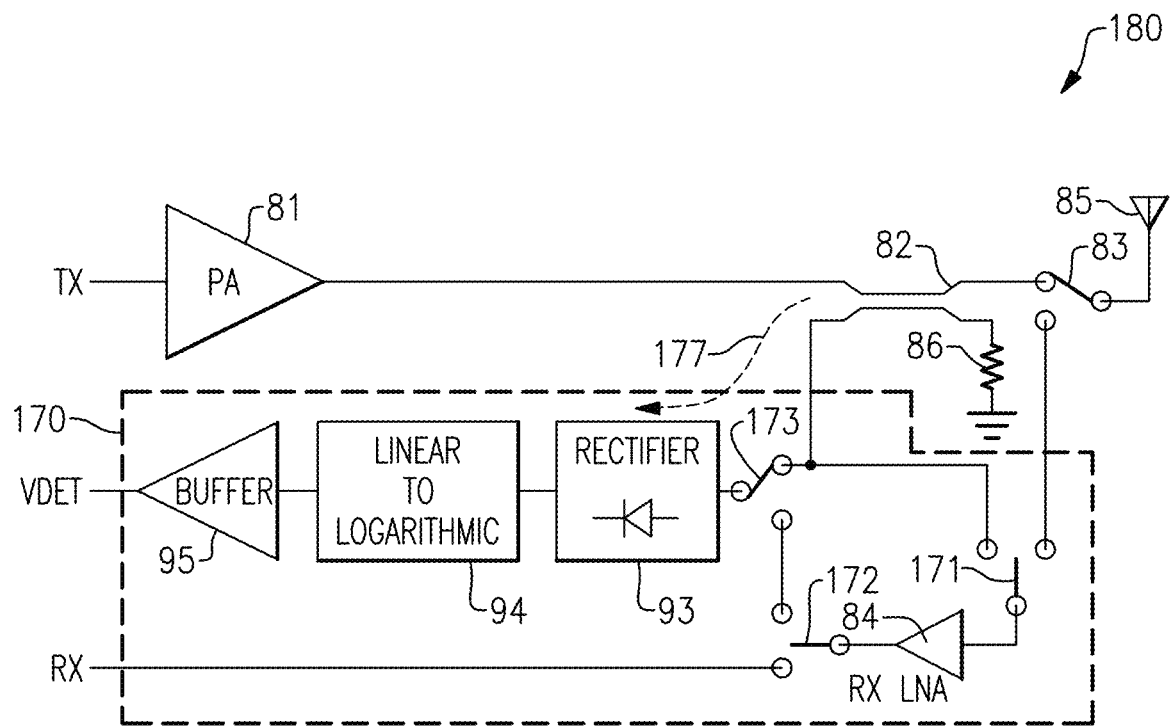
FIG. 4A is a schematic diagram of another embodiment of a front end system in which a power detector of the front end system operates in a first gain mode.
Figure 4B:
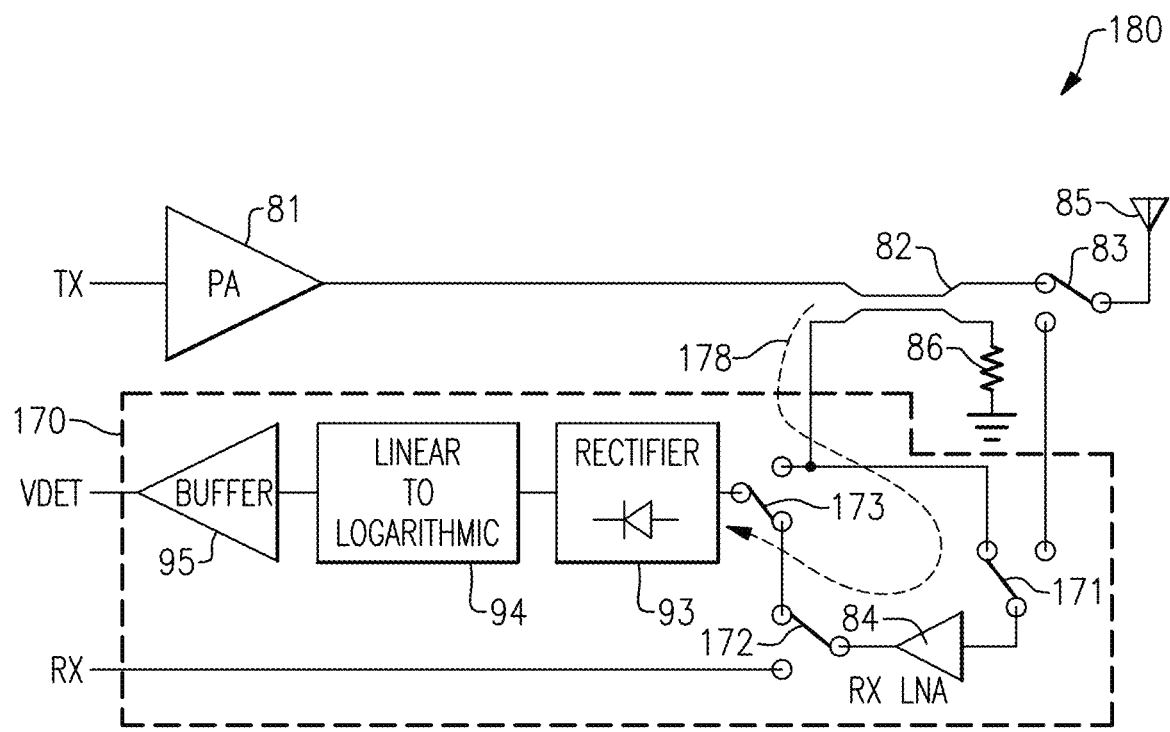
FIG. 4B is a schematic diagram of the front end system of FIG. 4A in which the power detector operates in a second gain mode.

FIGS. 4A and 4B depict another embodiment of a front end system 180. The front end system 180 includes a power amplifier 81, a directional coupler 82, a transmit/receive switch 83, a low noise amplifier 84, an antenna 85, a termination resistor 86, and a power detector 170. The power detector 170 includes a first path selection switch 171, a second path selection switch 172, a third path selection switch 173, a rectifier 93, a linear to logarithmic detector 94, and a buffer 95, in this embodiment.

In the illustrated embodiment, the low noise amplifier 84 is reused as the boosting amplifier of the power detector 170 when performing low power detection. For example, in TDD applications, the low noise amplifier 84 can be used for amplifying an RF signal received from the antenna 85 during receive time slots. Additionally, the receive path of the front end system 180 can be inactive during transmit time slots, and thus the low noise amplifier 84 can be selectively used by the power detector 170 during transmit time slots for transmit power detection.

The front end system 180 is depicted in a first gain mode in FIG. 4A. When operating in the first gain mode, the path selection switches 171-173 are used to bypass the low noise amplifier 84. Thus, a first detection path 177 bypassing the low noise amplifier 84 is selected. With reference to FIG. 4B, the front end system 170 is depicted in a second gain mode in which a second detection path 178 through the low noise amplifier 84 is selected.

Thus, the power detector 170 includes the first detection path 177 in which the low noise amplifier 84 is bypassed and a second detection path 178 including the low noise amplifier 84. Accordingly, the low noise amplifier 84 is selectively bypassed to control the input signal power level to the power detector 170, thereby enhancing dynamic range. Furthermore, the front end system 180 reuses the low noise amplifier 84 as the boosting amplifier for low power detection, thereby providing enhanced integration and/or reduced area relative to the front end system 100 of FIG. 2.

Figure 5:
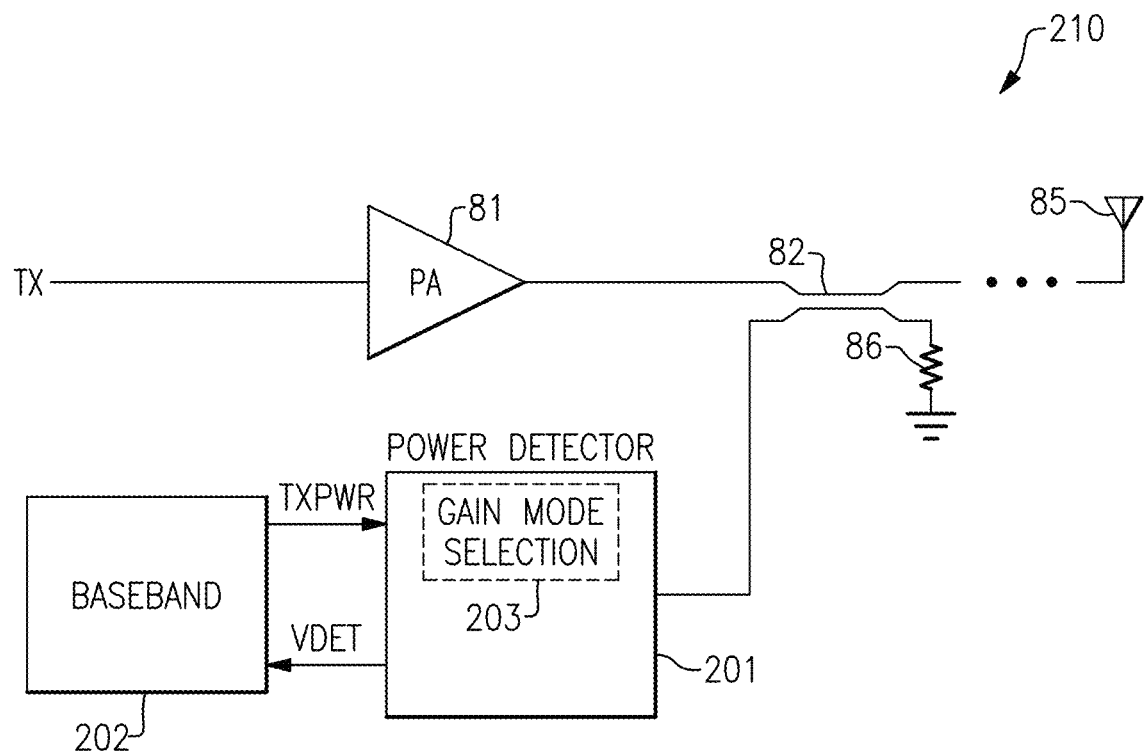
FIG. 5 is a schematic diagram of one example of gain mode selection for a front end system according to another embodiment.

FIG. 5 is a schematic diagram of one example of gain mode selection for a front end system 210 according to another embodiment. The front end system 210 includes a power amplifier 81, a directional coupler 82, an antenna 85, a termination resistor 86, and a power detector 201.

As shown in FIG. 5, the power detector 201 includes a gain mode selection circuit 203 for selecting a particular detection path of the power detector 201. For example, the gain mode selection circuit 203 can control the state of switches used to select a particular detection path of the power detector 201.

In the illustrated embodiment, the power detector 201 receives a transmit power control signal TXPWR from a baseband processor 202. Additionally, the gain mode selection circuit 203 processes the transmit power control signal TXPWR to select a particular detection path of the power detector 201.

Figure 6:
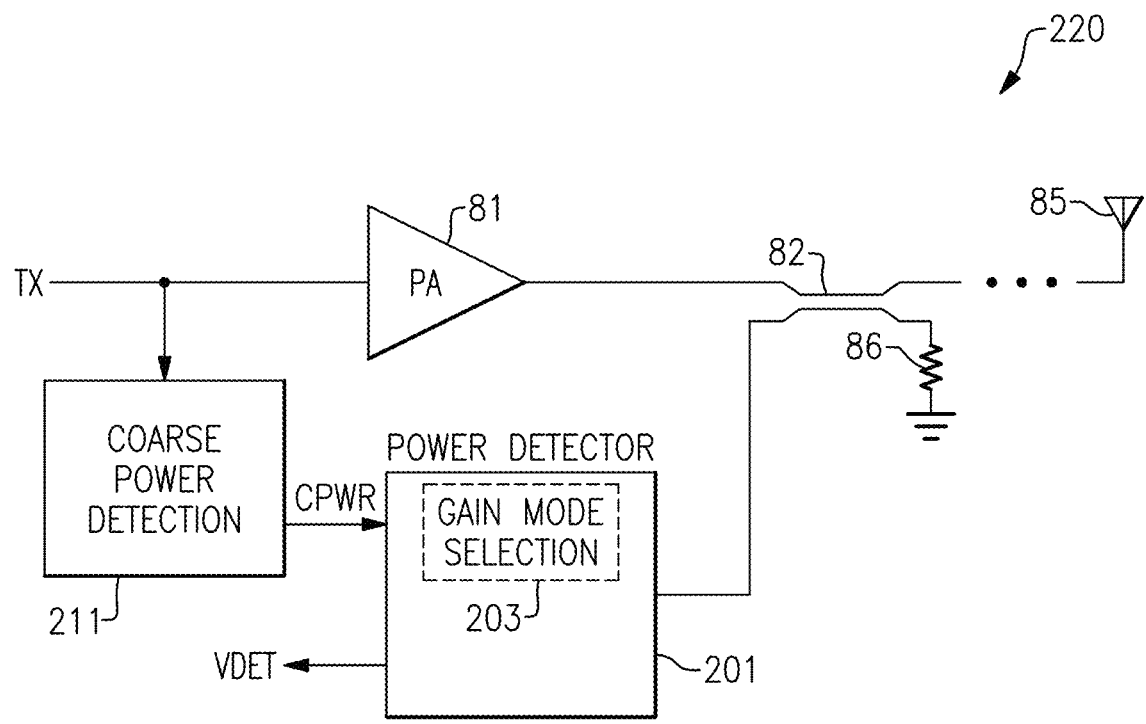
FIG. 6 is a schematic diagram of another example of gain mode selection for a front end system according to another embodiment.

FIG. 6 is a schematic diagram of another example of gain mode selection for a front end system 220 according to another embodiment. The front end system 220 includes a power amplifier 81, a directional coupler 82, an antenna 85, a termination resistor 86, a power detector 201, and a coarse power detection circuit 211.

In the illustrated embodiment, the coarse power detection circuit 211 generates a coarse power detection signal CPWR for the power detector 201 based on detecting the power of the RF transmit signal TX. Additionally, the gain mode selection circuit 203 processes the coarse power detection signal CPWR to select a particular detection path of the power detector 201. Thus, the coarse power detection signal CPWR indicates a coarse estimate of transmit power and is used for selecting a gain mode of the power detector 201, while the detection signal VDET from the power detector 201 provides an estimate of the transmit power with higher accuracy than the coarse power detection signal CPWR.

Figure 7:
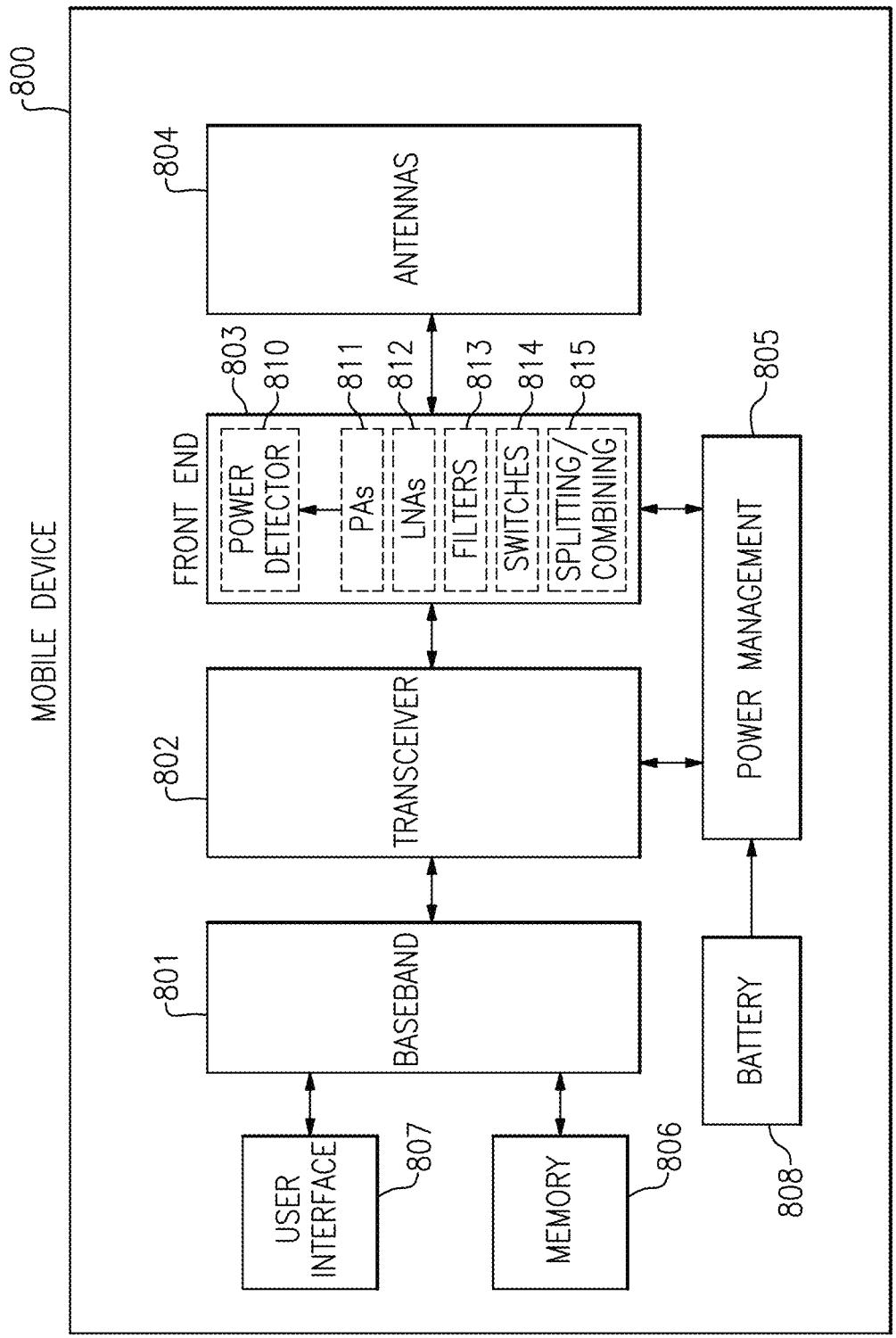
FIG. 7 is a schematic diagram of one embodiment of a mobile device.

FIG. 7 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 7 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes a power detector 810, power amplifiers (PAs) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both frequency division duplexing (FDD) and time division duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 7, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 7, the power management system 805 receives a battery voltage from the battery 808. The battery 808 can be any suitable battery for use in the mobile device 800, including, for example, a lithium-ion battery.

Figure 8:
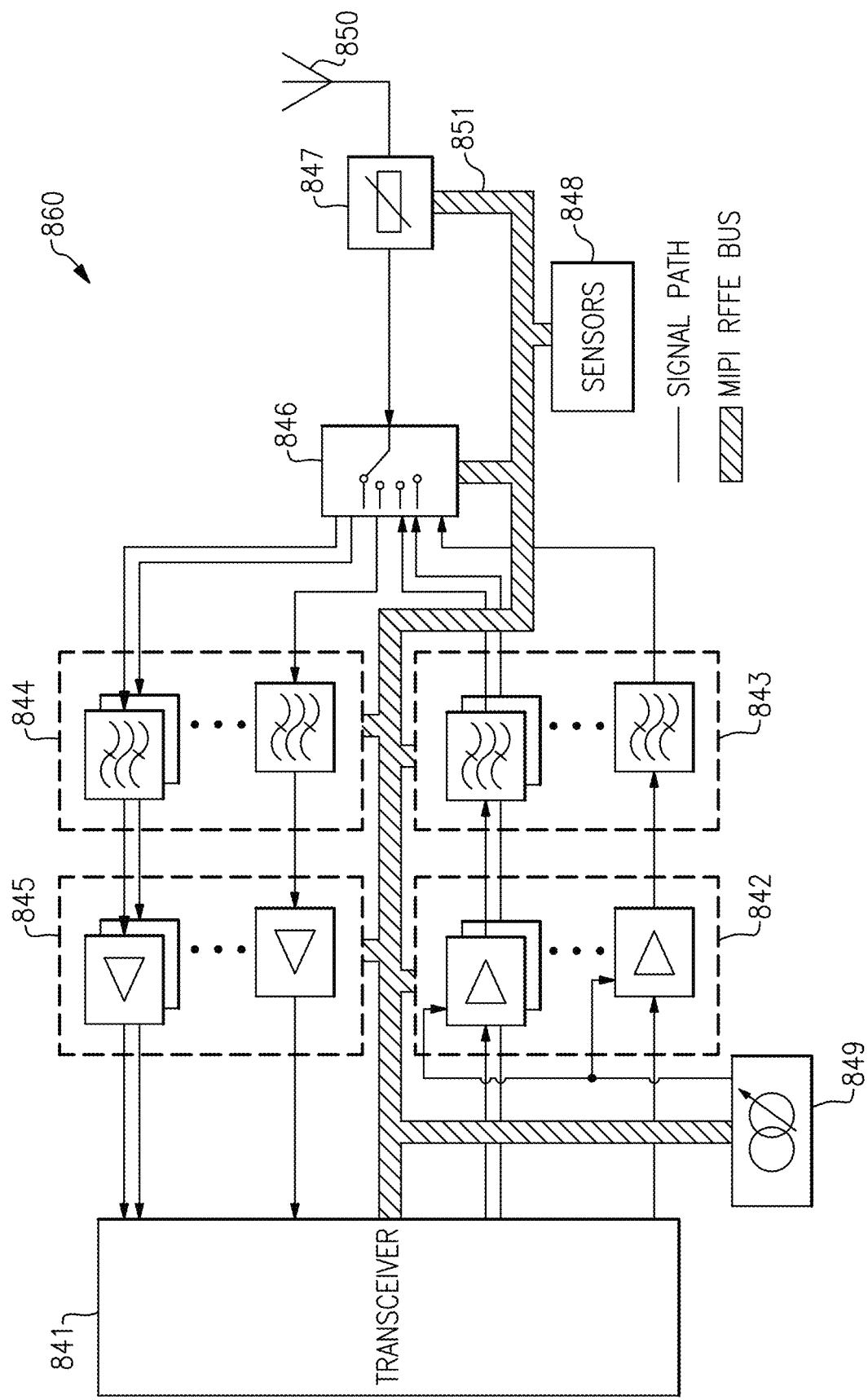
FIG. 8 is a schematic diagram of one embodiment of an RF communication system with a serial interface.

FIG. 8 is a schematic diagram of one embodiment of an RF communication system 860 including a serial interface 851 (a MIPI RFFE bus, in this example). The RF communication system 860 further includes a transceiver 841, a power amplifier module 842, a transmit filter module 843, a receive filter module 844, a low noise amplifier (LNA) module 845, an antenna switch module 846, a coupler module 847, a sensor module 848, a power management module 849, and an antenna 850.

As shown in FIG. 8, various components of the RF communication system 860 are interconnected by the MIPI RFFE bus 851. Additionally, the transceiver 841 includes a master device of the MIPI RFFE bus 851, and each of the RF components includes a slave device of the MIPI RFFE bus 851. The master device of the transceiver 841 sends control commands over the MIPI RFFE bus 851 to configure the RF communication system 860 during initialization and/or while operational.

The MIPI RFFE bus 851 illustrates one example of a serial interface used for controlling various components of an RF communication system. However, the teachings herein are applicable to RF communication systems implemented in a wide variety of ways.

Figure 9A:
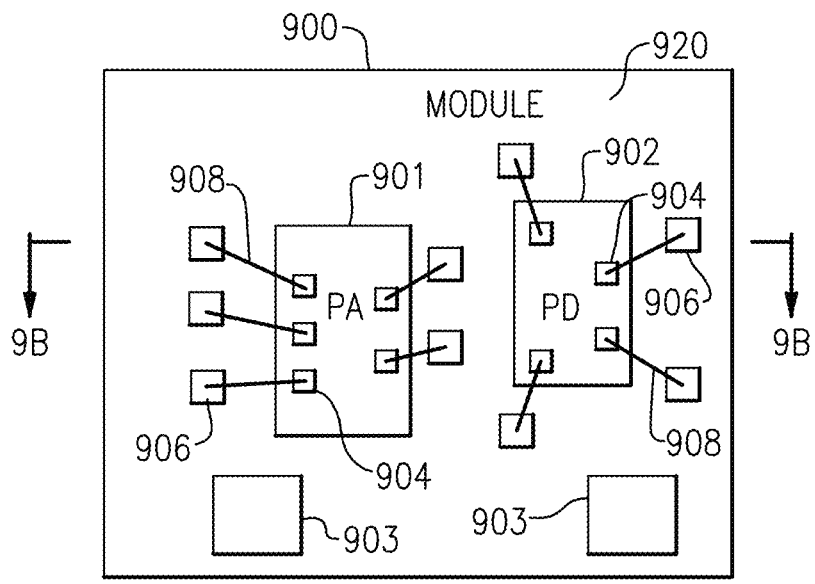
FIG. 9A is a schematic diagram of one embodiment of a packaged module.
Figure 9B:
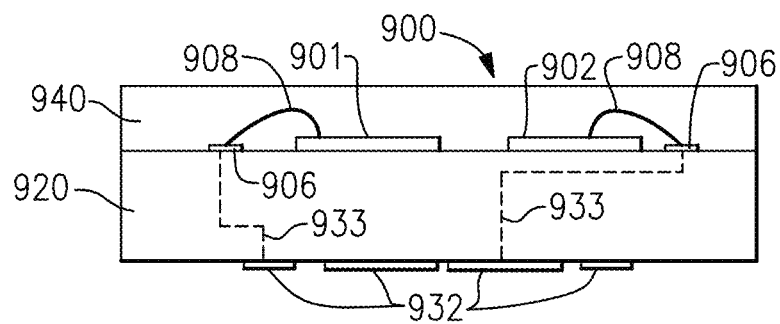
FIG. 9B is a schematic diagram of a cross-section of the packaged module of FIG. 9A taken along the lines 9B-9B.

FIG. 9A is a schematic diagram of one embodiment of a packaged module 900. FIG. 9B is a schematic diagram of a cross-section of the packaged module 900 of FIG. 9A taken along the lines 9B-9B.

The packaged module 900 includes a power amplifier die 901, a power detector die 902, surface mount components 903, wirebonds 908, a package substrate 920, and encapsulation structure 940. The package substrate 920 includes pads 906 formed from conductors disposed therein. Additionally, the dies 901, 902 include pads 904, and the wirebonds 908 have been used to connect the pads 904 of the dies 901, 902 to the pads 906 of the package substrate 920.

The power amplifier die 901 and the power detector die 902 are implemented in accordance with one or more features of the present disclosure. In certain implementations, a directional coupler is also included on the power amplifier die 901, on the power detector die 902, or integrated with the package substrate 920. Although shown as being implemented on separate dies, the teachings herein are also applicable to implementations using other numbers of dies. In one example, a semiconductor die includes a power amplifier, a directional coupler, and a power detector for enhanced integration.

The packaging substrate 920 can be configured to receive a plurality of components such as the dies 901, 902 and the surface mount components 903, which can include, for example, surface mount capacitors and/or inductors.

As shown in FIG. 9B, the packaged module 900 is shown to include a plurality of contact pads 932 disposed on the side of the packaged module 900 opposite the side used to mount the dies 901, 902. Configuring the packaged module 900 in this manner can aid in connecting the packaged module 900 to a circuit board such as a phone board of a wireless device. The example contact pads 932 can be configured to provide RF signals, bias signals, power low voltage(s) and/or power high voltage(s) to the dies 901, 902 and/or the surface mount components 903. As shown in FIG. 9B, the electrically connections between the contact pads 932 and the die 901 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling of the packaged module 900. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

Applications

Some of the embodiments described above have provided examples in connection with wireless devices or mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A front end system comprising:
   a low noise amplifier configured to amplify a radio frequency receive signal;
   a power amplifier configured to amplify a radio frequency transmit signal;
   a directional coupler configured to generate a sensed radio frequency signal based on sensing the radio frequency transmit signal amplified by the power amplifier; and
   a power detector configured to process the sensed radio frequency signal to generate a detection signal indicating an output power of the power amplifier, the power detector including a first detection path bypassing the low noise amplifier and a second detection path through the low noise amplifier, the power detector further including a first multi-throw switch connected to an input of the low noise amplifier and a second multi-throw switch connected to an output of the low noise amplifier.

2. The front end system of claim 1 wherein the power detector is configured to use the second detection path during a transmit time slot of a communication link that is duplexed by time division duplexing.

3. The front end system of claim 1 wherein the power detector further includes a rectifier, the first detection path and the second detection path each connected between the directional coupler and the rectifier.

4. The front end system of claim 3 wherein the power detector further includes a linear to logarithmic circuit configured to control generation of the detection signal based on a rectified signal from the rectifier.

5. The front end system of claim 4 further comprising a buffer connected to an output of the linear to logarithmic circuit.

6. The front end system of claim 1 wherein the power detector is configured to select a detection path from amongst the first detection path or the second detection path based on transmit power control data.

7. The front end system of claim 1 further comprising a coarse power detection circuit configured to generate a coarse power detection signal indicating a power of the radio frequency transmit signal, the power detector configured to select a detection path from amongst the first detection path or the second detection path based on the coarse power detection signal.

8. A mobile device comprising:
a transceiver configured to generate a radio frequency transmit signal; and
a front end system including a low noise amplifier configured to amplify a radio frequency receive signal, a power amplifier configured to amplify the radio frequency transmit signal, a directional coupler configured to generate a sensed radio frequency signal based on sensing the radio frequency transmit signal amplified by the power amplifier, and a power detector configured to process the sensed radio frequency signal to generate a detection signal indicating an output power of the power amplifier, the power detector including a first detection path bypassing the low noise amplifier and a second detection path through the low noise amplifier, the power detector further including a rectifier, the first detection path and the second detection path each connected between the directional coupler and the rectifier.

9. The mobile device of claim 8 further comprising an antenna configured to receive the radio frequency receive signal and to transmit the radio frequency transmit signal.

10. The mobile device of claim 8 wherein the power detector is configured to use the second detection path during a transmit time slot of a communication link that is duplexed by time division duplexing.

11. The mobile device of claim 8 wherein the power detector further includes a linear to logarithmic circuit configured to control generation of the detection signal based on a rectified signal from the rectifier.

12. The mobile device of claim 11 wherein the power detector further includes a buffer connected to an output of the linear to logarithmic circuit.

13. The mobile device of claim 8 wherein the front end system further includes a coarse power detection circuit configured to generate a coarse power detection signal indicating a power of the radio frequency transmit signal, the power detector configured to select a detection path from amongst the first detection path or the second detection path based on the coarse power detection signal.

14. The mobile device of claim 8 wherein the power detector further includes a first multi-throw switch connected to an input of the low noise amplifier, and a second multi-throw switch connected to an output of the low noise amplifier.

15. A method of transmit power detection, the method comprising:
amplifying a radio frequency receive signal using a low noise amplifier;
amplifying a radio frequency transmit signal using a power amplifier;
generating a sensed radio frequency signal based on sensing the radio frequency transmit signal from the power amplifier using a directional coupler;
processing the sensed radio frequency signal to generate a detection signal indicating an output power of the power amplifier using a power detector, the power detector including a first detection path bypassing the low noise amplifier and a second detection path through the low noise amplifier;
generating a coarse power detection signal indicating a power of the radio frequency transmit signal using a coarse power detection circuit; and
selecting a detection path from amongst the first detection path or the second detection path based on the coarse power detection signal.

16. The method of claim 15 further comprising using the second detection path during a transmit time slot of a communication link that is duplexed by time division duplexing.

17. The method of claim 15 further comprising selecting a detection path from amongst the first detection path or the second detection path based on transmit power control data.

18. The method of claim 15 wherein generating the detection signal includes rectifying the sensed radio frequency signal to generate a rectified signal using a rectifier.

19. The method of claim 18 wherein generating the detection signal further includes receiving the rectified signal as an input to a linear to logarithmic circuit.

20. The method of claim 19 wherein generating the detection signal further includes buffering an output of the linear to logarithmic circuit using a buffer.

* * * * *